United States Patent
Nakayama et al.

(10) Patent No.: US 7,535,082 B2
(45) Date of Patent: May 19, 2009

(54) NITRIDE SEMICONDUCTOR WAFER AND METHOD OF PROCESSING NITRIDE SEMICONDUCTOR WAFER

(75) Inventors: Masahiro Nakayama, Hyogo (JP); Naoki Matsumoto, Hyogo (JP); Koshi Tamamura, Tokyo (JP); Masao Ikeda, Tokyo (JP)

(73) Assignees: Sumitomo Electric Industries, Ltd., Osaka (JP); Sony Corporation, Tokyo (JP)

( * ) Notice: Subject to any disclaimer, the term of this patent is extended or adjusted under 35 U.S.C. 154(b) by 27 days.

(21) Appl. No.: 11/055,599

(22) Filed: Feb. 11, 2005

(65) Prior Publication Data
US 2005/0145879 A1    Jul. 7, 2005

Related U.S. Application Data

(62) Division of application No. 10/665,483, filed on Sep. 22, 2003, now Pat. No. 6,875,082.

(30) Foreign Application Priority Data

| May 6, 2003 | (JP) | ............................. 2003/128060 |
| Jul. 29, 2003 | (JP) | ............................. 2003/281647 |

(51) Int. Cl.
*H01L 23/544* (2006.01)
(52) U.S. Cl. ............................. 257/620; 257/E21.303; 257/E21.524; 438/460; 117/58
(58) Field of Classification Search .................. 17/197; 257/77, 620, E21.524, E21.526; 117/94, 117/58; 438/460; 451/36
See application file for complete search history.

(56) References Cited

U.S. PATENT DOCUMENTS 6,193,585 B1 * 2/2001 Tanabe et al. .................. 451/41

(Continued)

FOREIGN PATENT DOCUMENTS

EP    0 782 179 A2    7/1997

(Continued)

OTHER PUBLICATIONS

"Thick Layer Growth of GaN by Hydride Vapor Phase Epitaxy", IEICE, C-II, vol. J81-C-11, No. 1, pp. 58-64 (1998).

(Continued)

*Primary Examiner*—Howard Weiss
*Assistant Examiner*—John C Ingham
(74) *Attorney, Agent, or Firm*—McDermott Will & Emery LLP

(57) ABSTRACT

Nitride semiconductor wafers which are produced by epitaxially grown nitride films on a foreign undersubstrate in vapor phase have strong inner stress due to misfit between the nitride and the undersubstrate material. A GaN wafer which has made by piling GaN films upon a GaAs undersubstrate in vapor phase and eliminating the GaAs undersubstrate bends upward due to the inner stress owing to the misfit of lattice constants between GaN and GaAs. Ordinary one-surface polishing having the steps of gluing a wafer with a surface on a flat disc, bringing another surface in contact with a lower turntable, pressing the disc, rotating the disc, revolving the turntable and whetting the lower surface, cannot remedy the inherent distortion. The Distortion worsens morphology of epitaxial wafers, lowers yield of via-mask exposure and invites cracks on surfaces. Nitride crystals are rigid but fragile. Chemical/mechanical polishing has been requested in vain. Current GaN wafers have roughened bottom surfaces, which induce contamination of particles and fluctuation of thickness.

4 Claims, 8 Drawing Sheets

U.S. PATENT DOCUMENTS

| | | | |
|---|---|---|---|
| 6,413,627 B1 * | 7/2002 | Motoki et al. | 428/332 |
| 6,468,882 B2 | 10/2002 | Motoki et al. | |
| 6,596,079 B1 * | 7/2003 | Vaudo et al. | 117/97 |
| 6,648,966 B2 * | 11/2003 | Maruska et al. | 117/101 |
| 6,703,288 B2 * | 3/2004 | Nagasawa et al. | 438/483 |
| 6,806,508 B2 | 10/2004 | D'Evelyn et al. | |
| 2002/0185054 A1 | 12/2002 | Xu et al. | |

FOREIGN PATENT DOCUMENTS

| | | |
|---|---|---|
| EP | 0 966 047 A2 | 12/1999 |
| JP | 10-166259 | 6/1998 |
| JP | P2000-12900 A | 1/2000 |
| JP | P2000-22212 A | 1/2000 |
| JP | P2001-102307 A | 4/2001 |
| JP | P2002-261014 A | 9/2002 |
| JP | P2002-356398 A | 12/2002 |
| JP | P2003-165799 A | 6/2003 |
| WO | WO99/23693 | 5/1999 |
| WO | WO 01/68955 A1 | 9/2001 |
| WO | WO 02/101121 | 12/2002 |

OTHER PUBLICATIONS

"Preparation of Large Freestanding GaN Substrates by Hydride Vapor Phase Epitaxy Using GaAs as a Starting Substrate", Jpn. J. Appl. Phys. vol. 40 (2001) pp. L140-L143.

"Chemical polishing of bulk and epitaxial GaN", Journal of Crystal Growth 182(1997), p. 17-22.

"Ultraviolet photoenhanced wet etching of GaN in $K_2S_2O_8$ solution", J. Appl. Phys., vol. 89, No. 7, Apr. 1, 2001.

* cited by examiner

NITRIDE SEMICONDUCTOR WAFER AND METHOD OF PROCESSING NITRIDE SEMICONDUCTOR WAFER

This application is a divisional of application Ser. No. 10/665,483 filed Sep. 22,2003 now US Pat. No.6,875,082.

BACKGROUND OF THE INVENTION

1. Field of the Invention

This invention relates to distortion and smoothness of nitride semiconductor wafers which can be utilized as a substrate wafer for making blue light emitting devices (laser diodes (LDs) or light emitting diodes (LEDs)).

This application claims the priority of Japanese Patent Application No. 2003-128060 filed on May 6, 2003 and Japanese Patent Application No. 2003-281647 filed on Jul. 29, 2003, which are incorporated herein by reference.

2. Description of Related Art

Sapphire ($\alpha$-Al$_2$O$_3$) single crystals have been exclusively utilized as substrate wafers for making InGaN-type blue light emitting diodes and InGaN-type blue light laser diodes. GaN thin films, InGaN thin films or other nitride thin films are heteroepitaxially grown on a sapphire single crystal wafer. Light emitting devices are produced by piling n-type and p-type GaN and InGaN thin layers epitaxially on the GaN thin film grown on the sapphire wafer. Sapphire wafers are sold on the market and are easily obtained. Sapphire wafers have given satisfactory achievements as an essential part of blue light sources. Sapphire wafers, however, have weak points. Sapphire, which is an insulator, cannot lead electric current. Sapphire prevents us from making n-type or p-type sapphire. A sapphire substrate forbids us to make an n-electrode on a bottom of a device chip. An n-electrode should be formed upon a conductive n-type GaN layer grown upon a sapphire substrate. Both p- and n-electrodes are formed upon a top of an LED or LD device chip.

The top n-electrode requires a wide extra surface for the device chips. Existence of the top n-electrodes inhibits device makers from reducing chip sizes of LEDs or LDs. The top electrode is one drawback of sapphire wafers. Another weak point of sapphire is non-cleavage. Sapphire ($\alpha$-Al$_2$O$_3$) has low symmetry which deprives the crystal of natural cleavage. High mechanical rigidity is a further drawback for sapphire wafers. Without relying upon natural cleavage, a device-produced sapphire wafer is cut into individual chips by mechanical dicing, which raises manufacturing costs and lowers yields. Lattice misfitting between the sapphire wafer and GaN layers makes a lot of dislocations and degenerates a light emitting property of chips.

No GaN single crystal wafer has been available till now. Thin films of GaN are grown on a foreign material substrate. Use of sapphire substrates, silicon carbide substrates (SiC), gallium arsenide substrates (GaAs) and spinel substrates has been reported. The most prevalent foreign material substrate is a sapphire substrate as described hitherto. Since the materials of substrates and films are different, strong stress occur at an interface between films and foreign material substrates. The films grown on the foreign substrate exfoliate from the substrate due to the strong stress at an early stage. For avoiding the exfoliation, interposition of a low-temperature grown buffer layer and separation growth of individual GaN nuclei via small windows of a mask (ELO method) have been proposed. The low-temperature made GaN buffer layer has a function of alleviating inner stress at a film/substrate interface. The ELO (epitaxial lateral overgrowth) method can make thin GaN layers on a sapphire substrate by covering the sapphire substrate with a mask (e.g., SiO$_2$ or SiN), perforating the mask into small windows regularly aligning in a hexagonal pattern composed of repetitions of many equilateral-triangles for exposing the underlying substrate via the window, growing GaN nuclei on the separated exposed windows and reducing the inner stress.

① PCT-application, WO99/23693, ② Japanese Patent Laying Open No. 2000-22212 (Japanese Patent Application No. 10-183446), ③ Japanese Patent Laying Open No. 2000-12900 (Japanese Patent Application No. 10-171276), ④ Akira Usui, "Thick Layer Growth of GaN by Hydride Vapor Phase Epitaxy", IEICE, C-II Vol. J81-C-II No. 1, pp. 58-64, January 1998, ⑤ Kensaku Motoki, Takuji Okahisa, Naoki Matsumoto, Masato Matsushima, Hiroya Kimura, Hitoshi Kasai, Kikurou Takemoto, Koji Uematsu, Tetsuya Hirano, Masahiro Nakayama, Seiji Nakahata, Masaki Ueno, Daijirou Hara, Yoshinao Kumagai, Akinori Koukitu and Hisashi Seki, "Preparation of Large Freestanding GaN Substrates by Hydride Vapor Phase Epitaxy Using GaAs as a Starting Substrate", Jpn. J. Appl. Phys. Vol. 40 (2001) pp. L140-L143, describe the ELO of GaN films on GaAs or sapphire substrates. The ELO method, which is inherently a method of making thin films, can produce no thick layer. If a thick GaN layer piles on a substrate by the ELO method, a number of dislocations are produced and big inner stress is yielded. The large inner stress would exfoliate the GaN layer from the substrate. Thus, the ELO fails to make a freestanding GaN substrate. The ELO is insufficient to produce a thick single crystal GaN substrate wafer. Another improvement is required for making GaN freestanding single crystal bulks besides the ELO.

⑥ Japanese Patent Laying Open No. 2001-102307 (Japanese Patent Application No. 11-273882), which has the same applicant as the present invention, proposed a facet growing method of GaN. Instead of maintaining a mirror-flat c-plane on the top, the facet growth method intentionally makes facets and facet pits, maintains the facets and the facet pits on a growing surface, displaces dislocations by the facets, gathers the dislocations from neighboring regions into centers of the facet pits, reduces dislocation density in other regions, and obtains low dislocation GaN single crystals. The facet growth method of ⑥ enabled us to make a large freestanding GaN wafer of good single crystal for the first time. ⑥ cannot predetermine spots of the facet pits, because ⑥ lacks a contrivance of determining positions of the pits and the pits are born at random spots.

⑦ Japanese Patent Laying Open No. 2003-165799 (Japanese Patent Application No. 2002-230925) gave the GaN facet growing method an improvement of predetermining the positions of facet pits by depositing seeds on an undersubstrate, making facet pits following to the seeds. The seeds initiate closed defect assembling regions (H). Positions of the closed defect assembling regions coincide with the positions of the seeds on the undersubstrate. Other parts except the closed defect assembling regions (H) are good single crystal GaN.

Polishing is another important matter for the present invention. Polishing technology has not matured for nitride semiconductors, since independent, freestanding nitride crystal bulk wafers have not been produced on a practical scale yet. Thus, current polishing technology for other materials should be considered.

In the case of silicon semiconductors, silicon wafers are mechanically polished with alumina powder. Besides the mechanical polishing, processed silicon wafers having devices are polished for flattening rugged surfaces by chemical mechanical polishing (CMP) which makes use of colloidal silica and corrosive liquid. GaAs wafers are also treated with the chemical mechanical polishing (CMP), since some corrosive liquid for GaAs is known. People have believed that the CMP is impossible for sapphire and GaN. Sapphire is a refractory oxide. GaN is a sturdy nitride. Sapphire and GaN are chemically stable materials. A corrosive liquid for sapphire and GaN has not been reported.

⑧ Japanese Patent Laying Open No. 10-166259 (166259/1998) (Japanese Patent Application No. 8-332120) declared that it proposed a chemical mechanical polishing (CMP) of sapphire for the first time by an alkali liquid. However, ⑧ a makes a secret of details of the polishing liquid. ⑧ disclosed no concrete components of the alkali liquid. Nobody can obtain knowledge of the detail of the alkali. What is the alkali liquid as a polishing liquid for sapphire is still outstanding in spite of ⑧.

⑨ J. L. Weyher, S. Muller, I. Grzegory and S. Porowski, "Chemical polishing of bulk and epitaxial GaN", Journal of Crystal Growth 182 (1997), p17-22, reported that they CM-polished GaN (0001) crystal bulks with an NaOH or KOH solution. But, ⑨ insisted that CMP (chemical-mechanical polishing) was still impossible for high quality GaN crystals.

⑩ J. A. Bardwell, J. B. Webb, H. Tang, J. Fraser and S. Moisa, "Ultraviolet photoenhanced wet etching of GaN in $K_2S_2O_8$ solution", J. Appl. Phys., vol. 89, No. 7, p4142-4149, (2001), disclosed that GaN was wetly etched with a $K_2S_2O_8$ solution.

⑪ Japanese Patent Laying Open No. 2002-356398 (Japanese Patent Application No. 2001-166904) was contrived by the same inventor as the present invention and related to chamfering of a periphery of a GaN wafer. Freestanding circular GaN wafers had not existed, but it was possible to make them for the first time. Therefore, the inventor contrived to chamfer the periphery of the GaN wafer and to make OF for indicating a specified direction.

The technology of making a bulk GaN single crystal wafer is not fully matured yet. Technology of producing AlN and InN is far behind GaN. 50 mmφ (2-inchφ) freestanding GaN single crystal wafers are not produced on a commercial scale and do not come onto the market yet. The applicant of the present invention has a potential of making a circular 50 mmφ GaN freestanding single crystal wafer. 45 mmφ GaN wafers are also available for the applicant. Circular GaN freestanding wafers larger than 45 mmφ are suitable for substrate wafers for making light source devices (LEDs and LDs) owing to circularity and size-sufficiency. However, such large GaN wafers made by the state-of-the-art technology are annoyed by poor flatness, large distortion and bad roughness. GaN bulks made in vapor phase are annoyed by large distortion height H which randomly ranges between 200 μm and 30 μm. Thickness fluctuation exceeds 50 μm. Due to lack of a pertinent polishing method, surface roughness is over 10 μm. No circular GaN wafers prepared by the current technology satisfy the requirements of flatness, thickness uniformity and smoothness at present yet. GaN is chemically stable and physically rigid. GaN, however, is not tough and fragile. It is not easy to polish chemically-tenacious, physically-rigid but fragile GaN crystals. Slight physical shocks easily break GaN crystals. GaN, which has a hexagonal system, has asymmetric plane properties for a (0001)-plane and (000-1)-plane. The (0001)-plane is a surface consisting of Ga atoms. Thus, the (0001)-plane is sometimes called "(0001)Ga-plane". The (000-1) plane is a surface consisting of N-atoms. The (000-1) surface is called "(0001)N-plane". Two surfaces of the Ga-plane and N-plane are different in chemical and physical properties. Namely, the chemical and physical properties of GaN wafers have orientation dependence. The chemical obstinacy, physical rigidity, fragility and orientation dependence enhance difficulties of lapping (grinding) and polishing (whetting) of GaN bulk crystals.

GaN is transparent for visible light. A GaN wafer looks like a glass plate. Silicon (Si) wafers or gallium arsenide (GaAs) wafers are opaque. Unlike Si or GaAs, GaN wafers have difficulty of discriminating a top or bottom surface by difference of finishing for the top/bottom.

GaN has other many problems. Here, attention should be paid to distortion and roughness of GaN bulk crystals. GaN has a hexagonal system having three-fold symmetry around a c-axis. A large GaN crystal is unobtainable. A foreign material plate is employed as a starting substrate, which is called an "undersubstrate" for distinguishing the object GaN substrate wafer. For example, a GaAs (111) single crystal plate is adopted for an undersubstrate.

Collaboration of the ELO method and the facet-growth method grows a thick GaN single crystal layer on the (111) GaAs substrate in vapor phase. Then, the GaAs undersubstrate is eliminated and a GaN freestanding thick layer is obtained. GaAs and GaN have large lattice misfitting and big thermal expansion rate difference. The lattice misfit and thermal expansion difference cause large inner stress in the GaN film. The large stress is released by eliminating the GaAs undersubstrate. The released inner stress deforms the GaN film. Distortion is a serious problem for the GaN wafers.

A top convex distortion in which a top surface lifts at the center upward is defined as a positive distortion. A top concave distortion in which a top surface sinks at the center is defined as a negative distortion. Distortion is not eliminated by neither ordinary grinding nor ordinary polishing. Single surface polishing comprises the steps of sticking a wafer upon a polishing disc on a reverse side, bringing the polishing disc into contact with a whetting cloth covering a polishing turntable, pressing the polishing disc to the turntable, supplying polishing liquid, rotating the polishing disc and revolving the turntable in reverse directions. The object bottom surface of the wafer is whetted by the polishing cloth glued to the turntable. When the wafer is stuck to a flat bottom of the polishing disc before polishing, the wafer is flattened. When the wafer is removed from the flat disc after polishing, the wafer deforms back to the original distortion. Distortion of a wafer is not eliminated by polishing but survives the polishing. It is impossible to rid a wafer of distortion by the ordinary polishing. Large wafer distortion increases difficulties in wafer process and enhances probability of breaking, splitting and cracking. The wafer distortion makes it difficult to adjust a focus on the wafer in the masked exposure in photolithography and increases errors of patterning.

Simultaneous double surface polishing is composed of the steps of preparing a template having a plurality of round holes, laying the template on a lower turntable with a whetting cloth, putting object wafers on the lower turntable in the holes of the template, lowering an upper turntable onto the lower one, pressing the object wafers between the upper and lower turntables, supplying whetting liquid, rotating the upper and lower turntables in reverse directions and giving a planetary motion to the template. A top and bottom surfaces of the object wafers are polished simultaneously by the upper/lower turntables. When the wafers are picked up from the polishing machine, the wafers deform into the original distortion. Also in the double polishing, the distortion and inner stress survive the polishing. In general, lapping (grinding) and polishing (whetting) are ineffective for reducing or removing distortion from wafers. Polished or lapped wafers recover the original deformation. Annihilation of distortion is a formidable problem for GaN wafers.

Another problem is fluctuation of thicknesses of wafers. Thickness variations induce fluctuation of properties of devices produced on the wafer. Thickness should be constant in the overall area of a wafer for avoiding fluctuation of properties of devices. Suppression of the thickness fluctuation is another significant matter. There are several different kinds of estimation of the thickness fluctuation.

Here, a parameter TTV (total thickness variation) is adopted for expressing the fluctuation of thickness. The TTV is, in short, a difference between the largest thickness and the smallest thickness among defined sampling points. The TTV is obtained by mounting an object wafer on a flat stage with a vacuum chuck, pulling one surface flatly on the stage, measuring heights of the other surface at sample points two-dimensionally-aligning at a predetermined spatial sampling period, deducing the maximum thickness and minimum thickness on the whole object wafer, and subtracting the minimum from the maximum. The TTV depends upon the spatial period d of measuring spots. The spatial period d which is a distance between neighboring spots can be arbitrarily determined. For example, d=5 mm is available. Otherwise, d=1 mm or 0.5 mm is also available. A suitable spatial (sampling) period d should be defined by taking account of a texture of surfaces, size of wafers and required accuracy. The TTV is a value which is obtained by subtracting the smallest thickness from the largest thickness. The TTV is not microscopic fluctuation of thickness but macroscopic difference between the maximum and the minimum. Thus, the TTV is essentially a macroscopic value, although thickness should be measured at many spots aligning in a two-dimensional lattice at a constant interval. Actual values of the TTV may slightly differ for different spatial periods d for the same specimen. A decrement of the sampling period d increases measured TTV. But, the TTV would uniformly converge at a definite value $TTV_0$ at an infinitesimal limit of d→0. Smaller d gives more precise value of $TTV_0$ but takes more time to measure heights at all sampling points. Here, d=0.1 mm is adopted. Surface heights are measured at sampling spots which are two-dimensionally aligned in a lattice at the sampling period d=0.1 mm. Then, TTV is obtained by subtracting the minimum from the maximum.

Another problem is roughness of wafer surfaces. At present top surfaces of GaN wafers are mirror-polished but bottom surfaces are roughened. Difference of roughness discriminates the top from the bottom. The top surface should be mirror-smooth, because devices are fabricated upon the top by lithography. Since devices are not built upon the bottom surface, the roughened texture is allowable for the bottom surface. The inventors of the present invention are aware that a rough bottom surface incurs some problems. In the case of prevalent Si wafers, GaAs wafers and InP wafers, a final washing step eliminates fine particles adhering to top and bottom surfaces by oxidizing and reducing the surfaces of the wafers. The elimination of particles from surfaces is called "lift-off". The oxidization/reduction treatment succeeds in removing particles from wafer surfaces of Si, GaAs and InP which are chemically active and subject to oxidization. GaN is chemically more stable and more inactive than Si, GaAs and InP. GaN prevents a final washing step from lifting-off particles by oxidizing and reducing GaN surfaces with wet etchants. Rugged surfaces are far more likely to absorb and hold particles than smooth surfaces. If fine particles once stick to rugged bottom surfaces of GaN wafers, it is very difficult to remove the particles from the rugged surfaces. Roughened bottom surfaces of current GaN wafers, in particular, are apt to wear many fine particles which are tiny fragments of polishing material, wax or others. The final washing step allows some of the particles to remove from the bottom and to adhere to the top surface. FIG. 11, which has an abscissa of bottom surface roughness and an ordinate of top surface particle numbers, denotes that an increase of bottom surface roughness invites a conspicuous rise of particle numbers on the top surface.

FIG. 11 indicates the requirement of decreasing the bottom roughness for reducing contamination of top surfaces.

GaN freestanding bulk crystals are rigid but fragile. GaN lacks toughness unlike Si or GaAs. The rigid-fragility of GaN incurs another problem deriving from distortion. If a GaN wafer is strongly distorted, polishing steps are likely to induce occurrence of cracks originating from convex/concave extremes of the distortion. FIG. 3, which has an abscissa of curvature radii and an ordinate of crack occurrence rates, shows that stronger distortion with a shorter radius yields a higher rate of occurrence of cracks. FIG. 3 requests reducing distortion of wafers for avoiding occurrence of cracks.

SUMMARY OF THE INVENTION

A purpose of the present invention is to provide a freestanding nitride semiconductor wafer which ensures good morphology of films epitaxially grown on the nitride wafer. Another purpose of the present invention is to provide a freestanding nitride semiconductor wafer which is endowed with high yield of via-mask exposure in photolithography. A further purpose of the present invention is to provide a nitride semiconductor wafer which has a top surface with low probability of particle contamination in wafer processes. Another purpose of the present invention is to provide a gross-polishing method for reducing inherent distortion of nitride wafers. A further purpose of the present invention is to provide a chemical/mechanical polishing method for polishing rigid/fragile nitride semiconductor wafers into mirror-smoothness without fear of breaks.

The present invention proposes a freestanding nitride semiconductor wafer having maximum distortion height Hm less than 12 μm irrespective of having one, two, three or any other number of mode of distortion. The restriction Hm≦12 μm is required for all wafers bent in any modes of distortion.

The words of "modes of distortion" are yet ambiguous. Distortion should be described by maxima, minima and numbers of maxima and minima. For example, when a wafer has more than two maxima T1, T2, T3 . . . and more than two minima K1, K2, K3 . . . in the diametrical direction or in the angular direction, the wafer bends in saddle-point type distortion. Even in such cases, the distortion height H can be exactly defined by keeping all the minima in contact to a flat plane, measuring heights of all the maxima and taking the maximum of the measured heights. In the complex distortion also, the present invention requires the fundamental inequality Hm≦12 μm.

More favorable distortion height is Hm≦5 μm in the present invention. Distortion less than 5 μm still further improves morphology of epitaxial films piled on a wafer, enhances the yield of the via-mask exposure in photolithography and succeeds with a higher rate in preventing cracks from occurring in wafer processes.

When a wafer has a single maximum T1, the wafer is bent in a single-mode distortion as shown in FIG. 6(1). In the single-mode distortion, H and R can be related with each other by a simple equation which will be later described. In the case of a 45 mmφ wafer, a distortion height H=12 μm corresponds to a curvature radius R=21 m. Although the restriction defined by the peak height is valid for any diameter or any distortion mode, the restriction defined by the minimum curvature radius depends upon radii and modes of distortion. Here, restrictions of a curvature radius R for a 45 mmφ wafer, which is the minimum diameter proposed by the present invention, are described. Then, the curvature radius R of distortion should be longer than 21 m for a 45 mmφ wafer (R≧21 m). The optimum restriction H≦5 μm means R≧50 m in the case of a 45 mmφ wafer (R≧50 m).

In the case of a single-mode distortion, the present invention requires that the distortion height Hm should satisfy inequalities, (1) Hm≦12 μm in the case of 45 mmφ, in general, R≧21 m.
More favorably,
(2) Hm≦5 μm in the case of 45 mmφ, in general R≧50 m.

The restriction defined by Hm depends upon the size of the object wafer. Otherwise, the condition expressed by curvature radius R is common for any size of wafers. Restrictions by R and Hm are equivalent only for 45 mmφ wafers. The maximum height requirements Hm≦12 μm and more favorable Hm[5 μm are valid for a number of distortion peaks.

In many cases, GaN wafers are distorted in a single distortion mode, which has a single extreme. In addition to the single distortion mode, double or thrice distortion mode happens at smaller rates. The double distortion sometimes has two maximum extremes and two minimum extremes align on a diameter. Instead of simple linear aligning extremes, more complex multiple-distortion mode has two pairs of maximum and minimum extremes positioned at corners of a virtual square imagined on an object wafer, in which all the four extremes form saddle points. In the saddle point mode, two minimum extremes and three maximum extremes align on a diameter and two maximums and three minimums align on another diameter.

FIG. 10 shows a complex distortion of a wafer having three minimum extremes K1, K2 and K3 and two maximum extremes T1 and T2 on a diameter. This example happens to have five extremes aligning on a diameter. The four saddle point case mentioned above has a section of three modes of distortion as shown in FIG. 10. In this case, a three distortion mode has peak points K1, K2 and K3. If the three mode case should have a common allowable distortion height H, the allowable curvature radius R of the three distortion mode should be far smaller than the simple single distortion.

The three mode distortion decreases the size of a deforming area to one third (⅓) of the single mode. The allowable curvature radius decreases to one ninth (⅑) of the single mode case. In the three-mode distortion, an allowable curvature radius R should be longer than 2.3 m, since the height H should be less than 12 μm (R≧2.3 m for H≦12 μm). More favorably, a curvature radius should be larger than 5.6 m for the restriction of H≦5 μm (R≧5.6 m for H≦5 μm).

Instead of the pressed top turntable of the conventional polishing, the present invention adopts a non-pressing top turntable and distorted wafers in a no weight-polishing by pulling up the top turntable with a force nearly equal to the weight of the upper turntable. The polishing machine allows the upper and lower turntables to make a air gap which is wider than a thickness of a wafer. Pressure P acting upon a wafer should be less than 60 g/cm² for the present invention (P≦60 g/cm²). 60 g/cm² means 60 g weight acting upon a unit area of 1 cm². Here, g/cm² is not an MKS SI (international system) unit but a practical technological unit. There are many different units for signifying pressure. The same critical pressure as 60 g/cm² should be expressed in other units.

$P=60$ g/cm²=0.06 kg/cm²=60 g×980 cm/sec²×1/cm²=58800 dyn/cm²=5880 N/m²=5880 Pa=44.1 Torr=58.8mbar=0.0580atm.

Since normal polishing presses an object at several of kg/cm², the above 60 g/cm² is very small pressure which is effectively zero. The state of pulling up the upper turntable (P≦60 g/cm²) is called "pressureless". What features this invention is pressureless polishing which polishes a wafer in a quasi-free state.

Instead of pressing down the upper turntable, the present invention lifts up the upper turntable for gross-polishing an object wafer. A wide air gap is kept between the upper and lower turntables. The air gap is wider than the net thickness of the wafer but narrower than the distorted thickness of the wafer. The air gap allows the wafer to keep the inherent distorted shape in a quasi-free state.

Since the wafer is bent between the upper and lower turntables, protrusion portions and sharply edging portions keep contact with the polishing clothes on the turntables. Concave parts are separated from the polishing clothes. Only the protruding and the edging portions are eliminated but concave recesses are left untouched. The projecting portions and edging portions are decreased, which indicates decrement of distortion.

After a long time polishing, flat wafers without distortion are obtained by the free-state polishing of the present invention. The free-state polishing enables the present invention to eliminate any mode of distortion, e.g., double-mode, triplet-mode or other higher mode of distortion (FIG. 10) of nitride wafers in addition to the simple single-mode distortion as shown in FIG. 5. The polishing method takes much time but is effective for removing inherent distortion of nitride wafers. The problem of distortion of nitride wafers is solved by the present invention.

Another important property is surface roughness. The present invention requires that a roughness RMS of a top surface of nitride wafers should be less than 5 nm. The lower limit is 0.1 nm, which derives from the restriction of the technology of polishing of the present invention. The RMS is a root mean square of heights. There are Rmax, Ra and other parameters for signifying the roughness. Here, the present invention employs the RMS for representing the roughness. The roughness of the top is thus represented by 0.1 nm≦RMS≦5 nm.

The conventional GaN wafers have never been polished up to such smoothness, since no CMP (chemical/mechanical polishing) was available. As explained before, since nitride crystals are rigid and fragile, mechanical polishing alone cannot produce mirror smoothness of nitride wafers yet. Success of the CMP enables the present invention to give such high smoothness to surfaces. The CMP will be described later in detail.

FIG. 1 shows a relation between surface morphology after epitaxial growth and surface roughness or TTV (total thickness variation). Greater roughness induces a decline of morphology of an epitaxial wafer which has epitaxially grown films upon the bare GaN wafer having ragged surfaces. FIG. 1 indicates that epitaxial films have a tendency of transcribing the roughness of the substrate wafer and smoothness of wafer surfaces is important for making good epitaxial films.

More favorable smoothness of the top surface is defined to be less than 0.5 nm. Thus, the preferable requirement can be represented by 0.1 nm≦RMS≦0.5 nm.

The single crystal nitride semiconductor wafer of the present invention should have a bottom of roughness lower than RMS5000 nm, which is far smaller than the current bottom roughness. The minimum of the roughness of the bottom should be 0.1 nm which is a technical limit of polishing. Thus, the bottom surface roughness RMS of the present invention can be briefly expressed by an inequality 0.1 nm≦RMS (bottom)≦5000 nm.

FIG. 11 shows a tendency of an increase of a top surface particle number as bottom roughness rises. It is because the particles once adhering to the bottom separate from the bottom, turn around and contaminate the top. This invention can decrease the adhesion of particles on the top since the bottom has a smooth surface of small roughness. The above-mentioned CMP is effective to the bottom polishing.

In brief, the present invention requires that both surfaces should have the following roughness,

[General requirements]

| top surface roughness | 0.1 nm ≦ RMS ≦ 5 nm |
|---|---|
| bottom surface roughness | 0.1 nm ≦ RMS ≦ 5000 nm |

[More sophisticated requirements]

| top surface roughness | 0.1 nm ≦ RMS ≦ 0.5 nm |
|---|---|
| bottom surface roughness | 0.1 nm ≦ RMS ≦ 2 nm |

A freestanding single crystal nitride semiconductor wafer of the present invention has a diameter larger than 45 mmφ and a TTV (total thickness variation) less than 10 μm in the case of a 45 mmφ wafer in addition to the above-described roughness and distortion.

Here, the relation between the height H and the curvature radius R of distortion is described in short. FIG. 9 shows a relation between a central wafer height H and a curvature radius R which are different expressions of distortion of wafers in a simple mode. A diameter of a wafer is denoted by FMG. The diameter D of the wafer FMG is FG (D=FG). Curvature FMG is a part of a large sphere which has a center O. The distortion FMG has a curvature radius R=OF=OM=OG. The central height H is equal to MN (H=MN). The wafer diameter D satisfies an equation of D=FG=2R sin Θ. As Θ is a small angle, D=2RΘ in approximation.

The height H satisfies H=MN=MO−NO. MO=R and NO=OG cos Θ=R cos Θ. The height H is given by $$H = R - R \cos \Theta = 2R \sin(\Theta/2)^2 = D^2/8R. \quad (1)$$

This is an approximation equation for determining the relation between H and R. Since D/R is far smaller than 1, the approximation is a good one. The curvature radius R is reversely proportional to H. This relation equation includes the wafer diameter D as a parameter. A proportion constant includes a square of the diameter D. Unless D is determined, the relation is not fully decided. The present invention aims at a wafer which is larger than 45 mmφ (D≧45 mm). If R should be denoted by a meter unit and H should be signified in μm (micrometer) unit, Equation (1) is written as

| For D = 45 mm | R = 253/H. | (R; m and H; μm) | (2) |
|---|---|---|---|
| For D = 50 mm | R = 312/H. | (R; m and H; μm) | (3) |

In the case of a 2 inch wafer (D=50 mm), a curvature radius R=26 m gives a height H=12 μm. A curvature radius R=62 m gives H=5 μm for D=50 mm.

In the case of 45 mmφ wafers, the present invention can determine a distortion curvature R (denoted by a m unit) larger than $D^2/96$ (denoted by a mm unit) from the above equation (1).

The present invention restricts an allowable distortion height H to be less than 12 μm (H≦12 μm). H=12 μm is the maximum of allowable distortion heights. Thus, in the case of a 50 mmφ wafer, the minimum allowable curvature Rm is Rm=26 m and curvature R and height H should satisfy inequalities R≧26 m and H≦12 μm. Although the allowable maximum H is common, the minimum curvature radius Rm depends upon the wafer diameter D. For a 45 mmφ wafer, H≦12 μm or, equivalently, R≧21 m.

More preferable height should be less than 5 μm (H≦5 μm) in the present invention. For maintaining H at a value less than 5 μm, R≧62.5 m for D=50 mm and R≧50.6 m for D=45 mm.

In the case of a uniform distortion as shown in FIG. 6(1), as a curvature radius R of distortion rises, a mask/resist exposure yield in photolithography improves. Namely, a smaller height H and a larger radius R are favorable for making devices with higher yield. It is important to reduce distortion. The present invention requires that the distortion should be suppressed at most to be a 12 μm height.

Distortion necessarily accompanies any freestanding GaN single crystal which has been made in vapor phase upon a foreign material (e.g., GaAs) undersubstrate. The present invention gross-polishes (or laps) a wafer in a pressureless state. It takes long time to lap a distorted wafer in a quasi-free state. But the pressureless gross-polishing or lapping of the present invention succeeds in eliminating distortion from the object wafer down to H≦12 μm which is equivalent to R≧26 m in the case of 50 mmφ (2 inch) wafers or to R≧21 m in the case of 45 mmφ. The present invention further recommends to reduce the distortion down to H≦5 μm which is equivalent to R≧60 m in the case of 50 mmφ, which takes still longer time than the standard of H≦12 μm.

Gallium nitride (GaN) is rigid but fragile. Rigidity/fragility is a drawback of GaN or other nitride semiconductors. Application of strong pressure causes breaks of wafers in polishing process. The fragility prohibits mechanical polisher from applying strong pressure upon a nitride wafer. Mechanical polishing making use of silicon carbide, alumina or diamond powder cannot finish nitride wafers into mirror smoothness due to the restricted pressure application. GaN has longed for chemical-mechanical polishing which would dispense with strong pressure application.

GaN is chemically inactive. It has been believed that chemical-mechanical polishing is impossible for GaN. The inventors of the present invention examined various alkalis, acids or other chemicals for seeking probability of CMP of GaN. The inventors finally found out a probability of the GaN CMP by potassium peroxodisulfate ($K_2S_2O_8$) and ultraviolet rays. Potassium peroxodisulfate has strong oxidizing power. GaN is resistant to potassium peroxodisulfate itself. Potassium peroxodisulfate is not corrosive to GaN. Irradiation of ultraviolet rays, however, enhances the action of potassium peroxodisulfate. Ultraviolet-excited potassium peroxodisulfate strengthens oxidizing power. The inventors discovered that ultraviolet rays enable potassium peroxodisulfate and polishing powder (e.g., colloidal silica) to chemically polish GaN crystals. It turns out that silicon carbide, alumina or diamond powder is also effective as polishing powder in addition to the colloidal silica. This is the first success of CMP of GaN. The ultraviolet-enforced potassium peroxodisulfate chemical/mechanical polishing is useful for both rough-polishing and minute-polishing. A set of polishing powder, potassium peroxodisulfate and ultraviolet rays enables the inventors to chemical-mechanical polish rigid but fragile GaN wafers up to sufficient mirror smoothness with small pressure. The ultraviolet-excited potassium peroxodisulfate has strong corrosive power for chemically high resistant GaN. Chemical corrosion prepares active surfaces and helps powder granules to polish GaN wafers physically at low pressure. Since applied pressure is weak enough, fragile GaN wafers do not break. The inventors further confirmed that the ultraviolet-enhanced potassium peroxodisulfate with polishing granules is effective for polishing other nitride semiconductors, AlGaN, AlN and InN.

The conventional GaN wafers had a roughened bottom surface which is likely to attract particles and allow them to adhere thereon. The present invention polishes also a bottom surface into mirror smoothness. A smoothed bottom surface of a nitride wafer of the present invention is immune from particle contamination. Reduction of the particle contamination is an advantage of the present invention. Another advantage derives from small TTV (total thickness variation) less than 10 μm (TTV≦10 μm). The thickness of the wafer is nearly constant allover on the surface. The small TTV can suppress the fluctuation of properties of devices made upon the wafers. For example, surface morphology after epitaxial film-growth is improved by the low fluctuation of thickness (TTV) realized by the present invention.

DETAILED DESCRIPTION OF THE PREFERRED EMBODIMENTS

Figure 1:
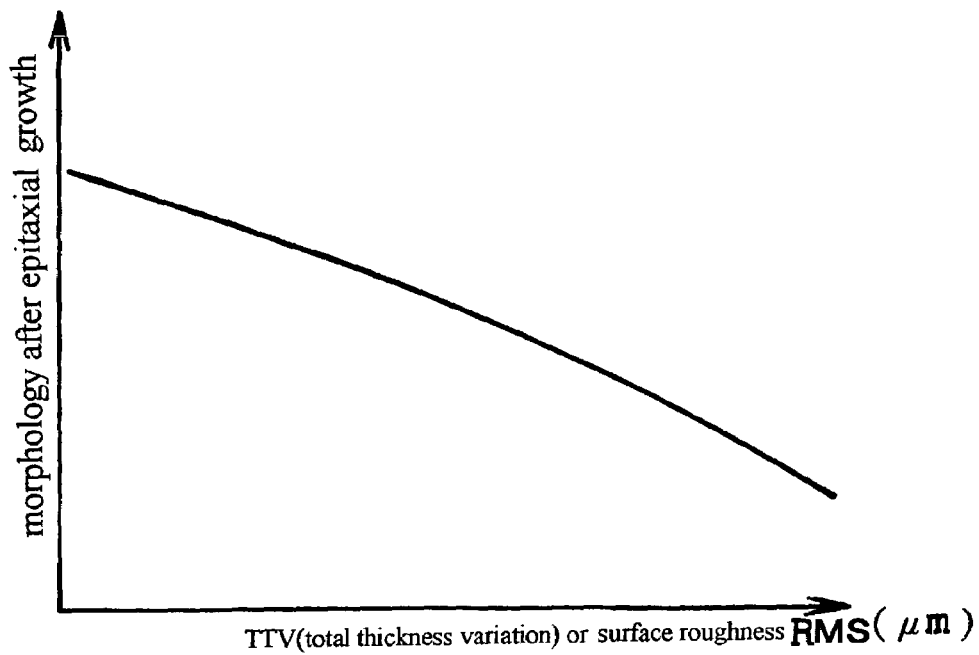
FIG. 1 is a graph of a relation between morphology of a GaN wafer after epitaxial growth and TTV(total thickness variation) or roughness RMS (μm) for showing that an increase of the TTV or RMS degrades surface morphology of the wafer piled with epitaxial thin films thereon.
Figure 2:
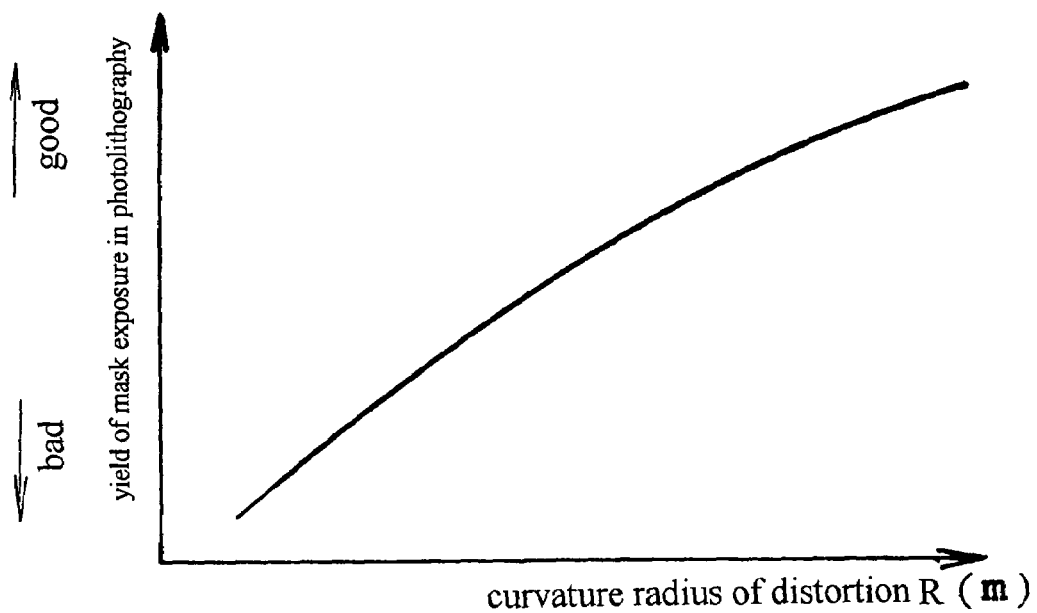
FIG. 2 is a graph denoting a relation between a yield of mask exposure wafers in photolithography and a curvature radius of distortion R(m) for showing that large wafer distortion lowers the yield of mask-exposed wafers. The ordinate is the yield. An upward direction denotes better yield and a downward direction denotes worse yield.
Figure 3:
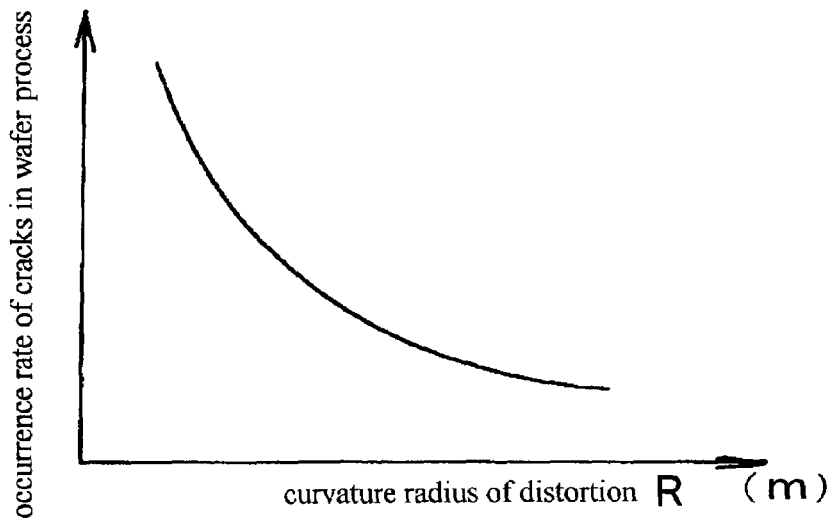
FIG. 3 is a graph of a relation between an occurrence rate of cracks in wafer-process and a curvature radius of distortion R(m) for showing that large distortion causes cracks on processed wafers.
Figure 4:
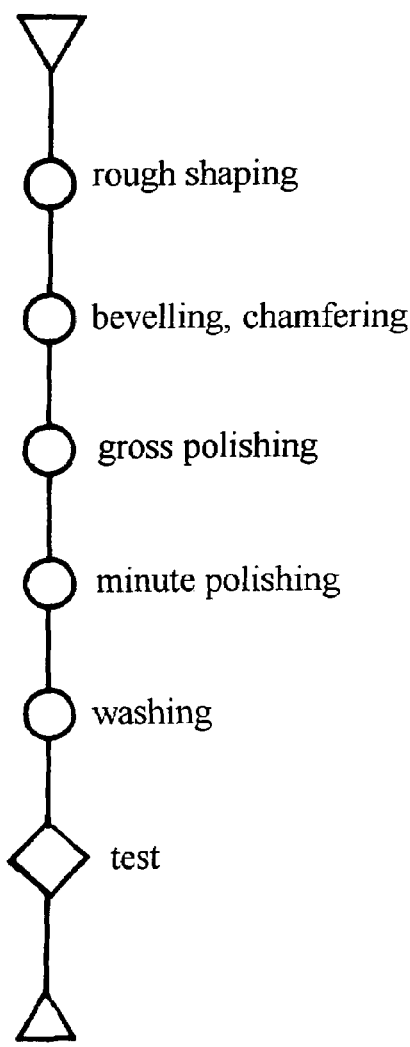
FIG. 4 is a flow chart of processing as-grown GaN wafers into mirror wafers including the steps of rough shaping an anomalous disc into a circular one, bevelling or chamfering of peripheries, gross-polishing for eliminating distortion, minute (second) polishing for producing mirror smooth surfaces, washing and testing.

Since there have been rare freestanding circular GaN wafers till now, processing of as-grown GaN wafers has not been established at present. Then, the inventors treated GaN circular wafers by a series of steps as shown in FIG. 4. The processing treatment comprises rough shaping, bevelling (or chamfering), gross polishing, minute polishing, washing and testing steps. An as-grown GaN is not circular. The rough shaping step reforms the as-grown wafer into a circular one. The chamfering step grinds the circumference into slanting edges for avoiding occurrence of breaks or splitting. Improvement of the following gross and minute polishing steps is a purpose of the present invention.

The polishing is done step by step by changing the size of powder. The polishing processes can be divided into the first (gross) polishing at a higher speed and the second (minute) polishing at a slower speed. Another role of the first polishing is to rid the wafer of the distortion. The second polishing is now done by a new CMP method contrived by the inventors of the present invention. Both kinds of polishing are described in detail.

Ordinary rough polishing for Si or GaAs wafers makes use of a round plate having a shaft for fixing a wafer on a side, pushes the round plate upon a lower turntable, revolves the turntable and rotates the round plate around the shaft. Even if the object wafer has inherent distortion, fitting the wafer upon a flat plate evens the wafer. The wafer is uniformly polished in a flattened state under strong pressure. When the polished wafer is taken off from the plate, the wafer retrieves the inherent distortion. The distortion remains intact. The ordinary single-side polishing is ineffective for reducing distortion. The present invention takes weightless, pressureless gross polishing with very small pressure less than $60 g/cm^2$ in quasi-free state for alleviating distortion by eliminating only protruding, edging portions. The pressureless polishing sandwiches a distorted wafer between lower and upper turntables in a bent state and whets the distorted wafer slowly without pressing down. The upper turntable is not pressed down but lifted up for keeping a wide air gap between the upper and lower turntables, which allow the wafer to bend in the inherent distortion.

Figure 5:
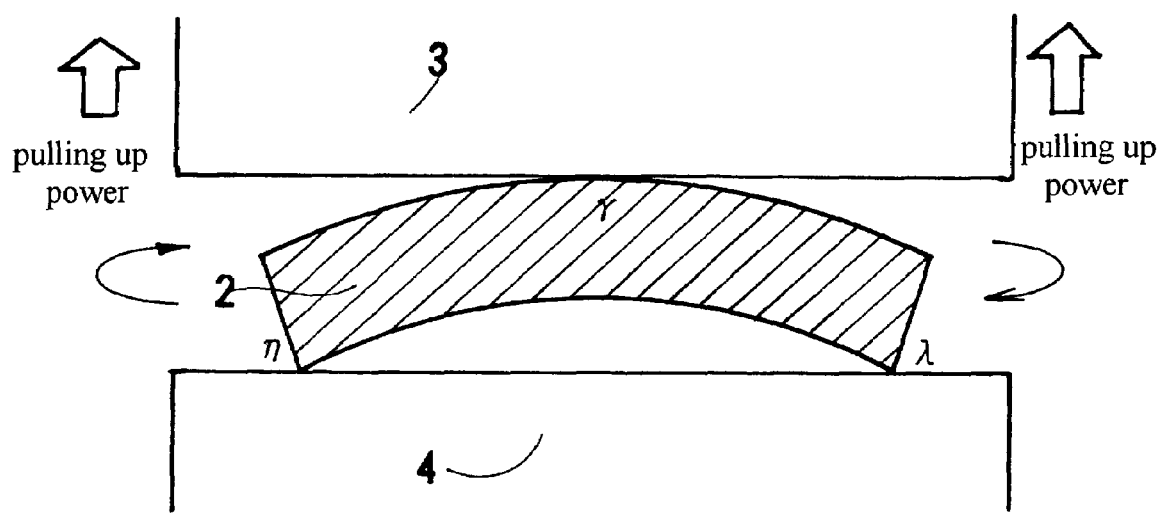
FIG. 5 is a schematic sectional view of a part of a gross-polishing machine for showing pressureless polishing which pulls up the upper turntable, maintains a distorted state of an object distorted wafer and eliminates protruding portions and edgy portions.

FIG. 5 is a schematic view of a weightless polishing of the present invention for gross-polishing a deformed GaN circular wafer. A polishing machine has a coaxial set of an upper turntable 3 and a lower turntable 4 which can rotate, rise and sink. A distorted wafer 2 is freely sandwiched between the lower turntable 4 and the upper turntable 3 with a wide air gap. The wafer is not stuck to a polishing disc which is prevalently used for wafer polishing. Polishing discs are useless, because the polishing discs hold a wafer in a forced flattened state. Both the upper and lower turntables are metallic turntables coated with polishing cloths. A polishing liquid is supplied between the upper and lower turntables. The upper and lower turntables rotate in the reverse direction or in the same direction at different rotation velocities for gross-polishing an object wafer in a distorted state. The polishing liquid includes water and free whetting granules, for example, silicon carbide (SiC), alumina ($Al_2O_3$) or diamond (C) granules. Unlike an ordinary polishing machine, the upper turntable 3 is not pressed down but is lifted upward. Lifting up of the upper turntable 3 makes an air gap which is wider than a net thickness of an object wafer. The object wafer exists between two turntables in a free distorted state. In the example, a bottom circumference η or λ touches the lower turntable 4 and a top γ center is in contact with the upper turntable 3.

Figure 6:
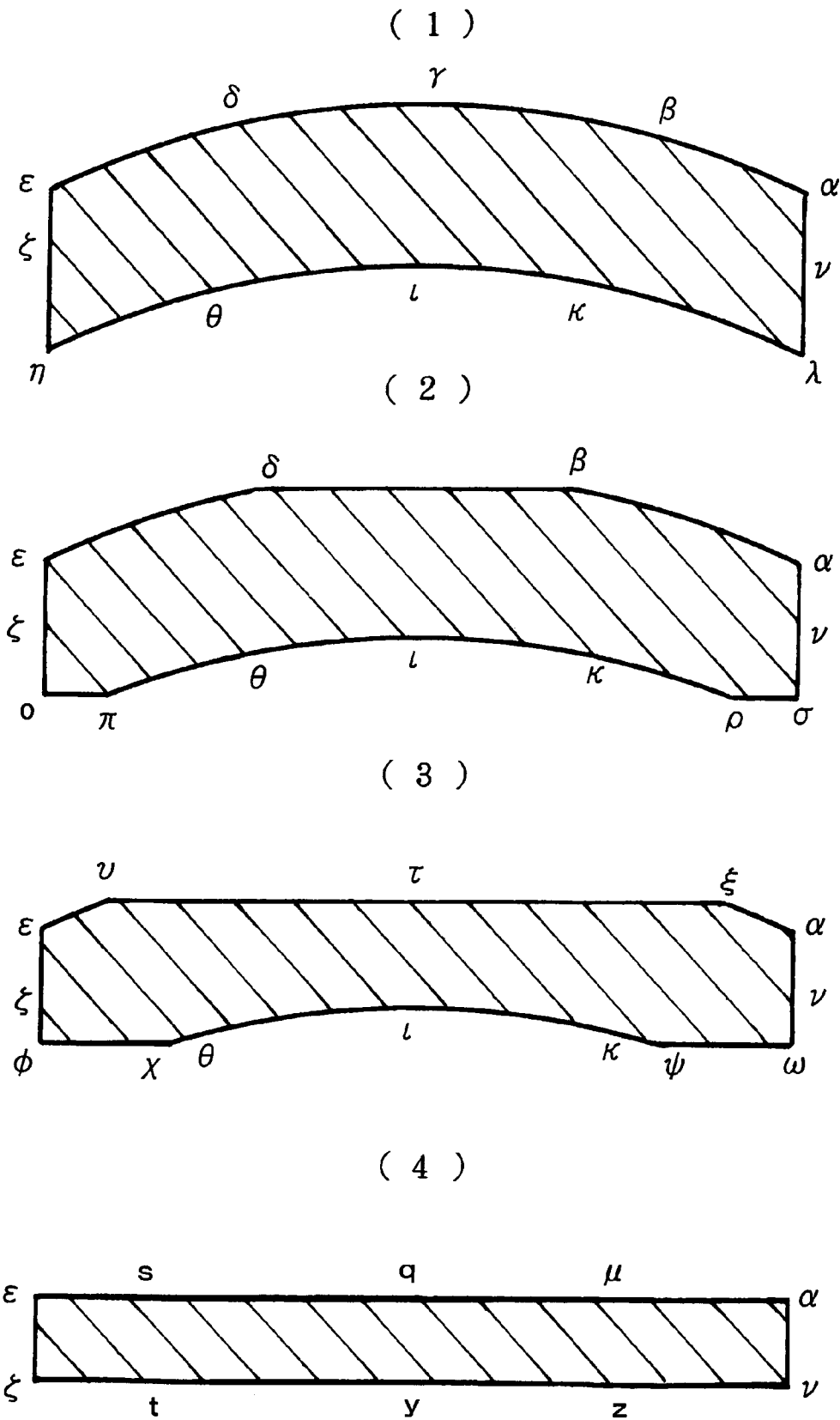
FIG. 6 is a set of sectional views of a wafer being processed by the pressureless gross-polishing step which lifts up an upper shaft for keeping the distorted state of the wafer.

FIG. 6 shows sections of a distorted wafer at various steps of the pressureless, weightless, quasi-free gross-polishing of the present invention for eliminating distortion from the object distorted GaN wafer. At first the object wafer has a single-mode distortion with a center upward bending and a periphery downward bending. FIG. 6(1) denotes a free state of the wafer. A top convex curve, a left side, a bottom concave curve and a right side are designated by αβγδεζθικλν. The wafer is upward convex at the beginning step. The pressureless polishing allows the wafer to distort in a free state. A protruding central top γ is in contact with a polishing cloth of an upper turntable and edging bottom peripheries λ and η touch a polishing cloth of a lower turntable. Other portions are left intact. Only the protruding top γ and the edging η and λ are polished away. As shown in FIG. 6(2), a flat round top βδ and flat fringes οπ and ρσ are created by the weightless polishing at the second step. Lower top portions αβ and δε and a concave bottom part θικ is left untouched. The polishing continues by gradually lowering the upper turntable for maintaining partial contact with the top of the wafer. The pressureless polishing is widening the top flat part ξτυ and the bottom flat annular fringes φχ and ψω, as shown in FIG. 6(3). At a final step, top lower circumferences ευ, ξα and a bottom concave θικ are polished away. A flat wafer having a flat top μqs and a flat bottom ζtyzν is obtained as shown in FIG. 6(4).

FIG. 5 shows a principle of the pressureless polishing for a single wafer on the teaching of the present invention. Actually, a plurality of wafers are simultaneously polished at both surfaces in a planetary motion in a polishing machine.

Figure 7:
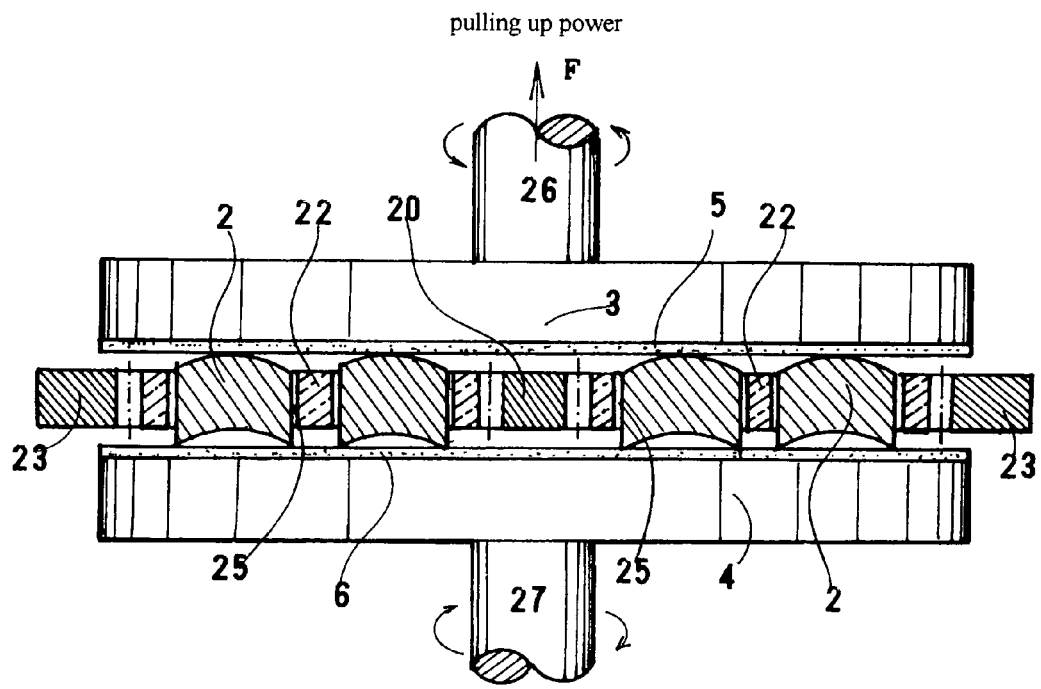
FIG. 7 is a sectional view of a pressureless gross-polishing machine which eliminates distortion from deformed wafers by inserting the distorted wafers in holes of templates on a lower turntable, putting an upper turntable above the lower turntable with a sufficient air gap, and revolving the turntables without pressing the wafers.

FIG. 7 shows a structure of a gross-polishing machine which polishes a plurality of wafers in a pressureless state. The polishing machine are not novel. But, a relation among upper, lower turntables, a template and wafers is novel. An upper turntable 3 faces downward a lower turntable 4. Polishing cloths 5 and 6 are glued to the turntables 3 and 4. The upper turntable 3 is rotated by an upper driving shaft 26. The lower turntable 4 is rotated by a lower driving shaft 27. Two turntables rotate around a common axial line. The upper turntable 3 can be lifted up and can be maintained at an arbitrary height for making an air gap between the upper and lower turntables.

The machine has a sun gear 20, a plurality of templates 22 with an outer-toothed planetary gear meshing with the sun gear 20 and an outer internal gear 23 meshing with the template 22 between the upper turntable 3 and the lower turntable 4. The central sun gear 20 and the outer internal gear 23 rotate in inverse directions. The templates 22 are thin plastic discs having a plurality of round holes 25 for holding circular wafers 2. The templates 22 are thinner than the wafers. Tops and bottoms of the wafers 2 are in contact with the upper and lower turntables. When m templates having n holes are employed, nm wafers can be treated at a time. The templates 22 revolve around the main axis and rotate around a center of the holes in a planetary motion.

A polishing liquid should be supplied between the upper and lower turntables. As mentioned before, mechanical polishing and chemical/mechanical polishing are available for the first (gross) polishing. Here, the first polishing employs a pure mechanical polishing. Then, the polishing liquid includes polishing powder and a liquid for dispersing the powder and for obtaining a lubricating property. In the case of mechanical polishing, the liquid is water or the like for dispersing powder granules. In the case of chemical/mechanical polishing, the liquid should include the above-described potassium peroxodisulfate. Rough polishing (first polishing) is here a mechanical polishing making use of silicon carbide (SiC), alumina or diamond granules dispersed in the liquid. In FIG. 7, wafers 2 held in the holes 25 of the template 22 are gross-polished by supplying the polishing liquid between the turntables, and rotating the sun gear 20 at an angular velocity $\Omega s$, the internal gear 23 at an angular velocity $\Omega i$, the upper turntable 3 at an angular velocity $\Omega u$ and the lower turntable 4 at an angular velocity $\Omega d$, where the definition of the angular velocities include directions and counterclockwise rotations are determined to be positive. The sun gear 20 has a shaft extending upward or downward to a motor. The motor rotates the sun gear. The upper and lower turntables are revolved by the upper and lower shafts 26 and 27. The upper turntable 3 can be revolved either in the same direction or in the reverse direction to rotation of the lower turntable 4. The internal gear 23 can be also revolved by another motor at an arbitrary rate. Here, S, P and I denote tooth numbers of the sun gear, the planetary gear and the internal gear. The tooth numbers satisfy a relation of $S+2P=I$. A revolving velocity $\Omega c$ of the template 22 is ruled by an equation of $S\Omega s + I\Omega i = (S+I)\Omega c$. A planetary rotating velocity $\Omega c$ of the template (planetary gears) and a rotation velocity $\Omega i$ of the internal gear satisfy $P\Omega t = I\Omega i$. Arbitrary rotation speed $\Omega t$ and revolving speed $\Omega c$ are realized by adjusting $\Omega u$, $\Omega d$, $\Omega s$ and $\Omega i$ which are all independent controllable parameters. Such a structure is favorable for remedying inherent distortion in accordance with the teaching of the present invention, because the machine need not fix an object wafer on a flat disc on one side.

What is significant in the machine in FIG. 7 is the upper turntable 3 being pulled upward by force F, air gaps being formed, and wafers being gross-polished in a free-distorted state in the air gaps. Projecting portions, e.g., bottom edgy peripheries and protruding top centers in the example, are polished but concave portions, e.g., bottom recesses and lower top peripheries, which are not in contact with the turntables, are not polished. Maintaining small area contact and small pressure with the wafers, the upper turntable 3 is gradually descended. Protrusions and edges are all polished away. Extra parts which protrude beyond an imaginary flat disc are eliminated. The distortion of the wafers are essentially removed by the pressureless polishing. Finally, flat, distortion-free wafers are obtained by the free-state gross polishing.

Figure 8:
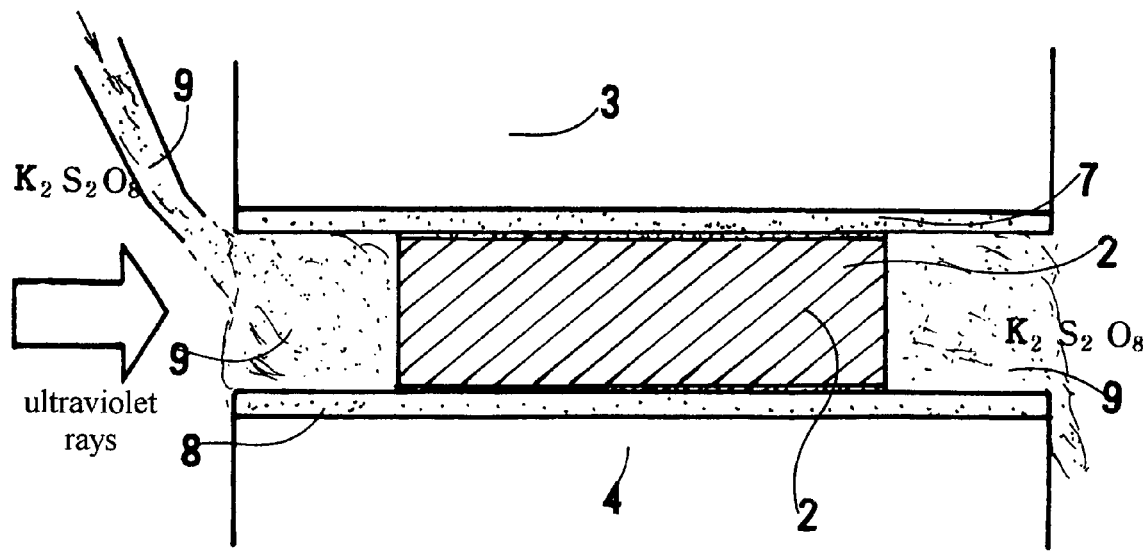
FIG. 8 is a sectional view of a CMP machine which polishes a GaN wafer by supplying a chemical/mechanical polishing liquid including potassium peroxodisulfate ($K_2S_2O_8$), potassium hydroxide (KOH) and colloidal silica and irradiating by ultraviolet rays for making mirror smooth wafers without occurrence of breaks and scratches.
Figure 9:
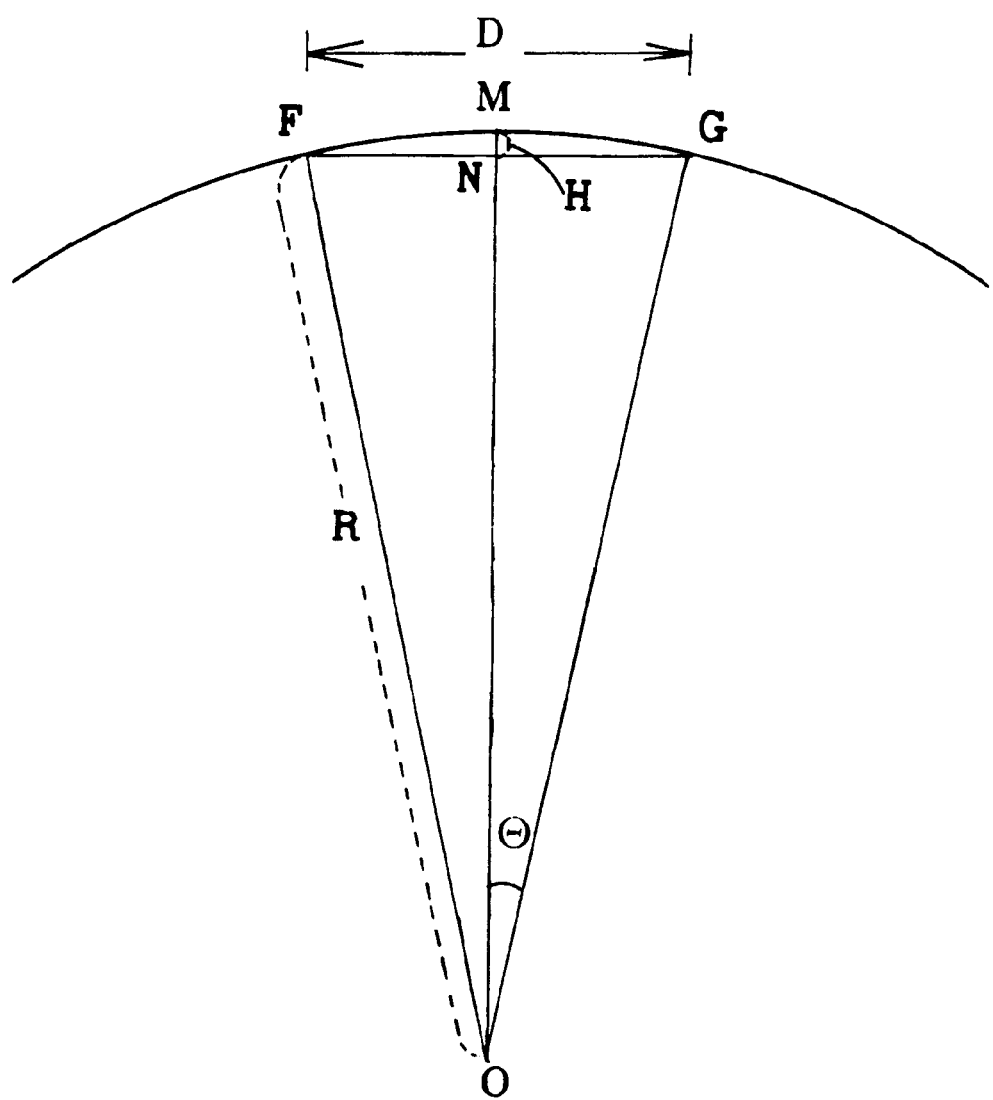
FIG. 9 is an explanatory figure for clarifying a relation of a wafer central height (H) of a diameter (D) and a curvature radius (R) for signifying distortion of a wafer.

The wafers should be further treated by a second (minute) polishing for making mirror wafers. The chemical/mechanical polishing should be employed for the minute polishing for enhancing flatness and smoothness of surfaces without applying excess high pressure. FIG. 8 shows the CMP fine polishing which supplies a mixture liquid 9 including powder, potassium hydroxide (KOH) and potassium peroxodisulfate ($K_2S_2O_8$) between the upper and lower turntables, and irradiates the liquid with ultraviolet rays. The composition of the polishing liquid, the polishing powder and the ultraviolet ray source are as follows.

| | |
|---|---|
| Polishing liquid | 2M KOH (potassium hydroxide) |
| | 0.5M $K_2S_2O_8$ (potassium peroxodisulfate) |
| Polishing granules | colloidal silica: |
| | granule size = 50 nmφ to 450 nmφ |
| | best size = 200 nmφ |
| Ultraviolet ray source | mercury lamp (Hg): wavelength λ = 254 nm |
| | power P = 10 mW/cm² |

As a polishing liquid of the second polishing step, the present invention can employ a polishing liquid including potassium hydroxide from 0.5M to 4M, potassium peroxodisulfate from 0.2M to 2M and polishing powder. The potassium peroxodisulfate is known as an oxidizing material. As described before, people have believed that it is impossible to chemical/mechanical-polish GaN which is chemically resistant. The inventors of the present invention found out that the ultraviolet-excited potassium peroxodisulfate enables us to CMP-polish GaN crystals. Potassium peroxodisulfate itself is inactive to GaN. But, ultraviolet rays enhance oxidization power of the potassium peroxodisulfate and give the potassium peroxodisulfate corrosive action to GaN.

The present invention has succeeded in CMP of GaN by the use of ultraviolet-enhanced potassium peroxodisulfate and polishing granules (e.g., colloidal silica) for the first time. The CMP can finish rigid but fragile nitride semiconductor wafers into mirror smoothness of 0.1 nm≦RMS≦5 nm without strong pressure. Without potassium peroxodisulfate, polishing granules (e.g., colloidal silica) cannot solely polish the GaN wafer into mirror smoothness. The potassium peroxodisulfate plays a main role of polishing.

What determines the final smoothness is, however, the size of polishing granules. The surface roughness can be raised by changing sizes of granules step by step. Larger diameter granules polish more rapidly than smaller diameter granules. Smaller diameter granules can finish wafers into higher smoothness than larger diameter granules. For example, in the case of colloidal silica, sizes of granules should be varied from 450 nmφ to 50 nm φ.

The sizes of granules rule the speed and the final roughness. But, what enables the granules to polish nitride wafers is the potassium peroxodisulfate. Another factor which determines the final roughness is time. It takes longer time to obtain more smoothly finished surfaces. RMS=0.1 nm is a lower limit originating from technical restrictions. The above written 0.1 nm≦RMS≦5 nm is sufficient smoothness to a top surface. Surface morphology of the films grown epitaxially upon the top surface of 0.1 nm≦RMS≦5 nm is satisfactory. However, 0.1 nm≦RMS≦0.5 nm is still better for the top surface roughness.

In the case of a bottom surface, 0.1 nm≦RMS≦5000 nm of smoothness is allowable. RMS≦5000 nm is enough for the bottom surface to maintain a top surface being immune from contamination of particles. But, RMS≦2 nm is more favorable for the roughness of the bottom surface.

[General requirements]

| | |
|---|---|
| top surface roughness | 0.1 nm ≦ RMS ≦ 5 nm |
| bottom surface roughness | 0.1 nm ≦ RMS ≦ 5000 nm |

[More favorable requirements]

| | |
|---|---|
| top surface roughness | 0.1 nm ≦ RMS ≦ 0.5 nm |
| bottom surface roughness | 0.1 nm ≦ RMS ≦ 2 nm |

Embodiment 1

2-inchφ GaN freestanding wafer 2-inchφ GaN freestanding wafers are made by an HVPE method which grows GaN films on a GaAs circular undersubstrate from a Ga-melt, HCl gas and $NH_3$ gas in a furnace by reactions of Ga+HCl→GaCl and GaCl+$NH_3$→GaN. The HVPE method makes the best use of the ELO (epitaxial lateral overgrowth) and the facet-growth which produces intentionally facet pits for gathering dislocations at bottoms of the pits and eliminates the GaAs undersubstrate and obtains a low-dislocation freestanding thick GaN film.

As-HVPE-grown GaN bulk wafers have rugged surfaces, random peripheral fringes, distortion and fluctuation of thickness. The rough-shaping step of FIG. 4 reforms the as-grown wafers into circular wafers by eliminating the random peripheral fringes.

The bevelling (chamfering) step of FIG. 4 eliminates sharp edges at circumferences of the circular wafers. Some of the prepared circular wafers have single-mode distortion and others have triple-mode or larger mode of distortion.

After the rough shaping and the chamfering, the pre-treated GaN circular wafers are processed by two steps of polishing in accordance with the teaching of the present invention.

[Conditions of gross-polishing]

The first (gross) polishing includes three steps using different sizes of granules. Polishing liquids including SiC granules of various sizes are employed.

| | | | |
|---|---|---|---|
| Polishing liquid: | Powder: silicon carbide (SiC) | | |
| | First step; | average size | 15 μm (#800) |
| | Second step; | average size | 6 μm (#2500) |
| | Third step; | average size | 2 μm (#6000) |
| | Liquid: oil slurry | | |
| Upper turntable: | | | cast iron 380 mmφ |
| Lower turntable: | | | cast iron 380 mmφ |
| Rotation speeds: upper-, lower-turntables: | | | 20 to 60 rpm |
| Sun gear: | | | 10 to 30 rpm |
| Internal gear: | | | 0 to 10 rpm |
| Liquid supply: | | | 500 cm³/min (circulation) |
| Pressure: | | | 30 to 60 g/cm² |
| Polishing speed: | first step | | 0.3 μm/min |
| | second step | | 0.05 μm/min |
| | third step | | 0.02 μm/min |
| Polishing margin: | total 60-80 μm (top + bottom) | | |

Although silicon carbide (SiC) is utilized as a polishing powder of the first polishing step here, one of colloidal silica, alumina and diamond powders with an average diameter of 20 μm to 0.5 μm can be suitably chosen. The first (rough-) polishing is done by sandwiching deformed wafers between the lower and upper turntables without pressure, polishing top and bottom surfaces at a slow speed and eliminating protruding portions and edges, as shown in FIG. 5 and FIG. 6. The inherent distortion of the wafer is removed by the pressureless polishing. In practice, object wafers are allotted in holes of templates, which make a planetary gear motion, and are maintained between the turntables. The polishing speeds are slow, which results from the pressureless polishing. The wafers after the free-state rough polishing have very small distortion or no distortion. Then, the wafers are treated by a second (minute) polishing.

[Conditions of minute-polishing]

The second (minute) polishing is a chemical/mechanical polishing making use of ultraviolet-excited potassium peroxodisulfate.

| Polishing liquid: | Powder: colloidal silica; average size 0.2 μm(200 nm) Liquid: KOH + $K_2S_2O_8$ Ultraviolet rays: mercury (Hg) lamp λ = 254 nm |
|---|---|
| Polishing cloth: | nonwoven fabric |
| Upper turntable: | cast iron 380 mmφ |
| Lower turntable: | cast iron 380 mmφ |
| Rotation speeds: upper-, lower-turntables: | 20 to 60 rpm |
| Sun gear: | 10 to 30 rpm |
| Internal gear: | 0 to 10 rpm |
| Liquid supply: | 1000 cm³/min |

A 2-inch (50 mmφ) wafer (A) polished by the processes has a single-mode distortion of R=100 m. Roughness of the top surface and the bottom surface was measured by an AFM (atomic force microscope). The measured roughness was RMS=0.3 nm to 0.5 nm in a square of 10 μm×10 μm for both the top and the bottom surfaces. Although the top and bottom surfaces cannot be discerned by the difference of roughness any more, a G-plane is defined as a top surface and an N-plane is defined as a bottom surface.

The fluctuation of thickness was TTV=3.5 μm (measured at a 0.1 mm interval). The obtained distortion R=100 m corresponds H=3.5 μm (for 50 mmφ) which satisfies the prescribed restriction H≦12 μm. The roughness (RMS=0.3 nm to 0.5 nm) also satisfies the requirements 0.1 nm≦RMS≦5 nm (top) and 0.1 nm≦RMS≦5000 nm (bottom). The measured thickness fluctuation (TTV=3.5 μm) suffices the predetermined condition TTV≦10 μm.

Figure 10:
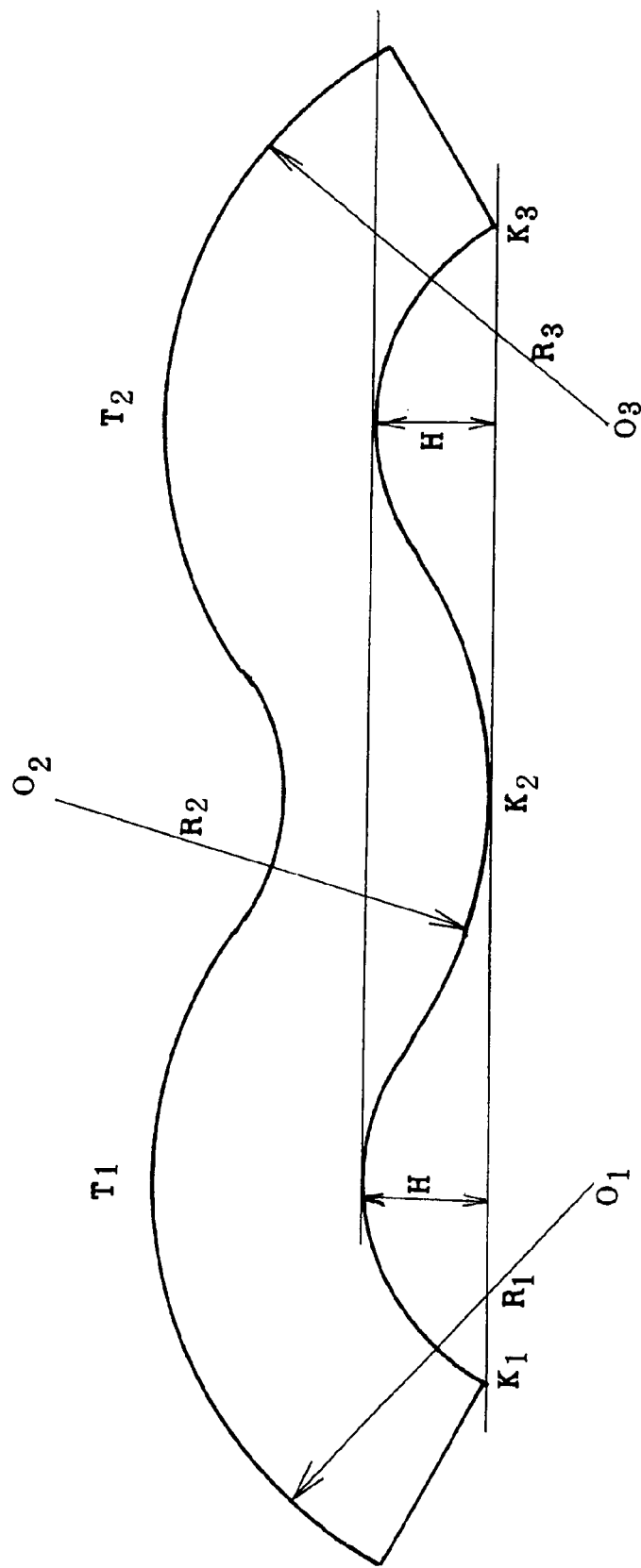
FIG. 10 is a section of a triplet-bending mode wafer having two maxima T1 and T2 and three minima K1, K2 and K3 along a diameter.
Figure 11:
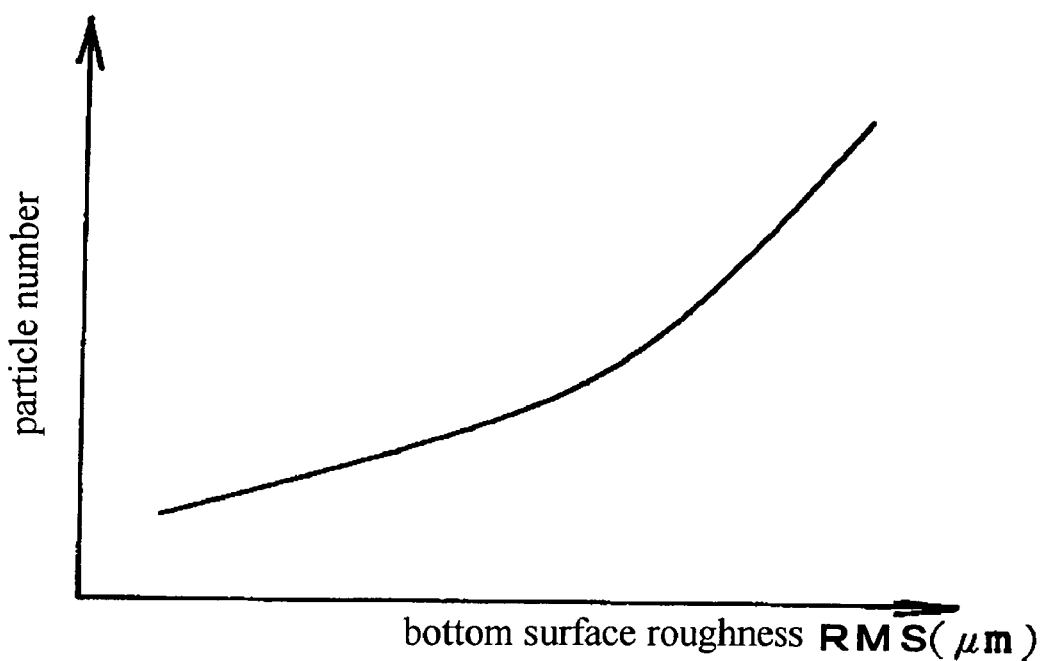
FIG. 11 is a graph of a relation between bottom roughness RMS (μm) and top particle number showing that an increase of the bottom roughness induces a rise of the number of particles lying on the top surface. The abscissa is bottom surface roughness RMS (μm). The ordinate is particle numbers on the top surface after wafer processes.

Another 2-inch (50 mmφ) wafer (B) polished by the same processes has a three-mode distortion with saddle points as shown in FIG. 10. A peak height H is H=2 μm. H=2 μm satisfies the requirement of H≦12 μm. AFM-measured roughness is RMS=0.2 nm to 0.4 nm in a sample square of 10 μm×10 μm for both the top and the bottom. The roughness (RMS=0.2 nm to 0.4 nm) also satisfies the requirements 0.1 nm≦RMS≦5 nm (top) and 0.1 nm≦RMS≦5000 nm (bottom). The fluctuation of thickness was TTV=3.1 μm at a 0.1 mm interval. The thickness fluctuation (TTV=3.1 μm) suffices the condition TTV≦10 μm.

We claim:

1. A gallium nitride wafer characterized in that the gallium nitride wafer is freestanding without being supported by other material substrate, having:
    a circular shape of a diameter larger than 45 mm;
    a top surface of Ga-plane (0001) on which crystal films are epitaxially grown;
    a bottom surface of N-plane (000-1);
    a multi-mode distortion having a plurality of maxima and a plurality of minima in which the largest value Hm of heights of the maxima is less than 12 μm with the minima in contact with a flat plane;
    a polished (0001) top surface of roughness satisfying 0.1 nm ≦RMS ≦5 nm without unpolished parts; and
    a polished (000-1) bottom surface of roughness satisfying 0.1 nm ≦RMS ≦5000 nm without unpolished parts.

2. The gallium nitride wafer according to claim 1, wherein TTV (total thickness variation) measured at sampling points defined at an interval 0.1 mm on the wafer is less than 10 μm.

3. A gallium nitride wafer characterized in that the gallium nitride wafer is freestanding without being supported by other material substrate, having:
    a circular shape of a diameter larger than 45 mm;
    a top surface of Ga-plane (0001) on which crystal films are epitaxially grown;
    a bottom surface of N-plane (000-1);
    a multi-mode distortion having a plurality of maxima and a plurality of minima in which the largest value Hm of heights of the maxima is less than 5 μm with the minima in contact with a flat plane;
    a polished (0001) top surface of roughness RMS satisfying 0.1 nm ≦RMS ≦0.5 nm without unpolished parts; and
    a polished (000-1) bottom surface of roughness satisfying 0.1 nm ≦RMS ≦2 nm without unpolished parts.

4. The gallium nitride wafer according to claim 3 wherein TTV (total thickness variation) measured at sampling points defined at an interval 0.1 mm on the wafer is less than 10 μm.

* * * * *